(12) United States Patent
Mayer et al.

(10) Patent No.: US 10,587,830 B2
(45) Date of Patent: Mar. 10, 2020

(54) METHOD FOR CONTROLLING AN ACTIVE PIXEL IMAGE SENSOR

(71) Applicant: Teledyne e2v Semiconductors SAS, Saint Egreve (FR)

(72) Inventors: Frédéric Mayer, Voiron (FR); Frédéric Barbier, Fontanil-Cornillon (FR); Stéphane Gesset, Saint Laurent du Pont (FR)

(73) Assignee: TELEDYNE E2V SEMICONDUCTORS SAS, Saint Egreve (FR)

( * ) Notice: Subject to any disclaimer, the term of this patent is extended or adjusted under 35 U.S.C. 154(b) by 56 days.

(21) Appl. No.: 15/747,057

(22) PCT Filed: Jul. 29, 2016

(86) PCT No.: PCT/EP2016/068221
§ 371 (c)(1),
(2) Date: Jan. 23, 2018

(87) PCT Pub. No.: WO2017/021328
PCT Pub. Date: Feb. 9, 2017

(65) Prior Publication Data
US 2018/0367748 A1    Dec. 20, 2018

(30) Foreign Application Priority Data
Aug. 3, 2015    (FR) ...................... 15 57460

(51) Int. Cl.
*H04N 5/3745*    (2011.01)
*H04N 5/335*    (2011.01)
(Continued)

(52) U.S. Cl.
CPC ... *H04N 5/37452* (2013.01); *H01L 27/14612* (2013.01); *H04N 5/3559* (2013.01);
(Continued)

(58) Field of Classification Search
CPC .. H04N 5/37452; H04N 5/3559; H04N 5/378; H04N 5/35536; H04N 5/3743; H01L 27/14612
(Continued)

(56) References Cited

U.S. PATENT DOCUMENTS 7,663,681 B2 * 2/2010 Lee .................. H04N 5/3575
                                                       250/208.1
8,648,947 B2 * 2/2014 Sato .................. H04N 5/32
                                                       250/200
(Continued)

FOREIGN PATENT DOCUMENTS

EP    2247093 A2    11/2010
EP    2634595 A1    9/2013
(Continued)

OTHER PUBLICATIONS

International Search Report and Written Opinion for PCT/EP2016/068221, dated Oct. 10, 2016.

*Primary Examiner* — Seung C Sohn
(74) *Attorney, Agent, or Firm* — Pilloff Passino & Cosenza LLP; Sean A. Passino; Rachel K. Pilloff

(57) ABSTRACT

In a sensor comprising active pixels including a photodiode PHD, a memory node MN and a read-out node SN, the memory node being provided to hold the charge generated by the photodiode at the end of an integration period enabling integration in global-shutter mode and a correlated double sampling read-out, provision is made for the charge-storage capacity of the memory node to be at least N times higher than the charge-storage capacity of the photodiode (N being an integer higher than or equal to 2) and provision is made to carry out, in each integration and read-out cycle, during the integration duration Tint(i), N transfers $Tri_1$, $Tri_2$, $Tri_3$ of charge from the photodiode to the memory node, the
(Continued)

N transfers being equally distributed over the integration duration. The dynamic range of the sensor is improved under high light levels.

8 Claims, 4 Drawing Sheets

(51) Int. Cl.
    *H04N 5/355*       (2011.01)
    *H04N 5/374*       (2011.01)
    *H01L 27/146*     (2006.01)
    *H04N 5/378*       (2011.01)

(52) U.S. Cl.
    CPC ......... *H04N 5/35536* (2013.01); *H04N 5/378* (2013.01); *H04N 5/3743* (2013.01)

(58) Field of Classification Search
    USPC ........................................................ 250/208.1
    See application file for complete search history.

(56) References Cited

U.S. PATENT DOCUMENTS

| | | | |
|---|---|---|---|
| 9,006,632 B2 * | 4/2015 | Ihori | ........................ H04N 5/32 |
| | | | 250/208.1 |
| 2011/0019045 A1 | 1/2011 | Lin | |
| 2012/0153125 A1* | 6/2012 | Oike | ................. H01L 27/14612 |
| | | | 250/208.1 |
| 2014/0247378 A1 | 9/2014 | Sharma et al. | |

FOREIGN PATENT DOCUMENTS

| | | |
|---|---|---|
| FR | 2961631 A1 | 12/2011 |
| JP | 2006311515 A | 11/2006 |

* cited by examiner

INTEGRATION

CDS READ-OUT

METHOD FOR CONTROLLING AN ACTIVE PIXEL IMAGE SENSOR

TECHNICAL FIELD

The invention relates to electronic image sensors the operation of which employs active pixels in MOS technology. More precisely, the invention relates to a method for controlling the various transistors which make up the active pixel.

PRIOR ART

Active pixels most often comprise a photodiode that converts received photons into electric charge, and a plurality of MOS transistors allowing the read-out of this charge and its conversion to electrical voltage to be controlled. In a matrix-array sensor, the rows of pixels are addressed individually and the voltages output by the pixels are applied to column conductors common to the pixels of a given column. Read-out circuits at the bottom of the column allow the voltages present on the columns to be read out and converted to digital form. For example, for each addressed row of pixels, the voltages present on the columns are sampled. The samples are stored in capacitors of the read-out circuit. The samples are then converted into digital form by an analogue-to-digital converter (for example one converter for each column of pixels).

Active pixels using a photodiode generally comprise at least four transistors: a transfer transistor serves to transfer the charge from the photodiode to what is called a read-out node, which is a capacitive charge-storage node; a read-out transistor, which is connected in a voltage follower configuration and the gate of which is connected to the read-out node in order to bring its source to a voltage representing the voltage of this node; a row-selection transistor controlled by a row conductor, for selecting an entire row of pixels and connecting the output of the follower transistor of each pixel to the column conductor corresponding to this pixel and, thereby, to the read-out circuit at the bottom of the column; and a reset transistor allowing the potential of the read-out node to be reset to a reference value.

The amount of charge generated by the photodiode is measured by calculating the difference between the potential level of the read-out node obtained after the transfer, and the reference potential level obtained after the read-out node is reset.

Active-pixel structures may be controlled in various ways. In particular, images may be captured using what is called the global shutter technique, in which all the pixels integrate charge generated by light during an integration period that is the same for all the pixels. Next, the pixels are read out row by row. In the technique called the rolling shutter technique, the integration period is shifted in time from one row of pixels to the next.

The global shutter technique especially makes it possible to avoid distortion effects when images of moving objects are captured.

In an active-pixel structure comprising four or five transistors, the sequence of the phase of integration common to all the pixels is the following:

for the time of an initialization control pulse, charge is forced out of all the photodiodes. The end of this pulse sets the start of the integration duration of the photodiodes: they may once more accumulate the charge generated under the effect of the light to which they are exposed. Charge may be removed by simultaneously turning on, for the time of the initialization pulse, the transfer transistor and reset transistor of the read-out node. The charge is then removed to the drain of the reset transistor. However, it is generally preferred to use a specific fifth transistor, the source of which is connected to the photodiode of the pixel, the charge being removed to the drain of this transistor.

all the transfer transistors are turned on simultaneously, for the time of a control pulse applied to their gates: the charge generated and accumulated by each photodiode from the start of the current integration duration is transferred to the associated read-out node. It is the end of this transfer control pulse that sets the end of the integration duration for all the pixels.

After each integration duration, the read-out phase of the pixels may start. The read-out is carried out sequentially, row by row. For each of the pixels of a row, the selection transistor of the pixel is turned on, for the time of a selection control pulse, and during this time:

the signal level applied to the column conductor is sampled by the read-out circuit located at the bottom of the column of the pixel; then the reset transistor of the read-out node is turned on, for the time of a reset control pulse, and the reference level applied to the column conductor is sampled by the read-out circuit.

The read-out circuit may then deliver as output a measurement of the difference between the signal level and the reference level. However, this level is not a precise measurement of the amount of charge generated in the photodiode because the random noise called kTC noise is not removed. Indeed, this noise is generated by the reset of the read-out node by the reset transistor, and means that the potential applied to the read-out node is not absolutely certain.

If this uncertainty is to be removable, with the aim of increasing the dynamic range of the sensors to encompass low light levels, it is necessary for the signal level to be applied to the read-out node after it has been reset, so that this signal level takes into account this uncertainty. In other words, it is necessary to initialize the read-out node first, sample the corresponding reference potential level, then apply the signal level (transfer) and next sample the signal level. A correlated double sampling (CDS) read-out is spoken of. With a four- or five-transistor structure such as described, a CDS read-out is only possible in a rolling-shutter integration mode. A CDS read-out is not possible in global-shutter integration mode.

Thus, in the prior art, structures including a memory node between the photodiode and the read-out node have been proposed. The memory node makes it possible to store the charge generated by the photodiode after each of the durations of integration common to all the pixels, for the time it takes, in each row of pixels, to initialize the read-out node of each of the pixels, and to sample the corresponding reference level with the read-out circuit of each of the pixels of the row, then to transfer the charge from the memory node to the read-out node and to sample the signal level with the read-out circuit. These structures comprising an intermediate memory stage thus make it possible to employ both the global-shutter capture technique and correlated double sampling, allowing the amount of charge generated in the photodiode of each of the pixels, during the integration duration in question, to be precisely measured. In practice, provision is then made for two transfer transistors (or gates), a first between the photodiode and the memory node and a second between the memory node and the read-out node. The first transfer transistor between the photodiode and the memory node is then the transistor that controls the end of each integration duration for all the pixels at the same time, this end coinciding with the end of the transfer control pulse in the memory node. The second transfer transistor is employed in the pixel-row read-out phase.

Publication US 2014/0247378 proposes another use of the memory-node pixel structure, to adjust the exposure duration of the photodiodes, for example depending on the colour of the pixels and on the intensity of the light. It is a question of controlling one or more sub-periods of exposure of the photodiodes during the duration of each acquisition cycle. The duration of each sub-period is a fraction of the duration of the cycle, and the actual exposure duration, during which the pixel accumulates charge, is equal to the sum of the durations of the sub-periods of the pixel and shorter than the duration of the cycle.

In the present invention, it is these active-pixel structures including a memory node between the photodiode and the read-out node, which structures are suitable for providing a correlated double sampling read-out function, that are addressed. These structures, examples of which may be found in publications FR2961631 and JP20063115150, allow both an image to be captured by all the pixels simultaneously in the same integration duration (global shutter function) and a CDS read-out of the pixels, row by row.

These structures have a dynamic range that is optimized at the low end, since they are low read-out noise structures (CDS read-out).

In the presence of bright light there is however a risk of saturation of the photodiode, this limiting dynamic range at the high end. Now, the maximum storage capacity of photodiodes depends on the area occupied by the photodiode, which for its part determines the size of the pixel. It is certainly not desired to increase this size; the tendency is even rather to decrease it, and to compensate for the loss of aperture by using microlenses to concentrate the light on the photodiodes of the pixels.

SUMMARY OF THE INVENTION

According to the invention, to improve the high-end dynamic range of these sensors, it is proposed to adopt the two following measures:

on the one hand, provision is made for the charge-storage capacity of the memory node to be at least N times higher than the charge-storage capacity of the photodiode (N being an integer higher than or equal to 2); and on the other hand, provision is made to perform N transfers of charge from the photodiode to the memory node, said transfers being regularly spaced over the integration duration.

It is in general easy to provide a memory node having a storage capacity a plurality of times higher than the storage capacity of the photodiode without this leading to too great a reduction in the optical aperture of the pixel. Specifically, the memory node may be formed by an insulated gate, the capacitance per unit area of which is very much higher than the capacitance per unit area of the photodiode.

Thus, the invention relates to a method for taking images with an active-pixel sensor comprising at least one row of active pixels in which sensor the active pixels each comprise a photosensitive element, a read-out node and a memory node between the photosensitive element and the read-out node, and at least one first charge-transfer transistor between the photosensitive element and the memory node, one second charge-transfer transistor between the memory node and the read-out node, one transistor for resetting the read-out node, one follower transistor having its gate connected to the read-out node and one pixel-selection transistor that is connected between the source of the follower transistor and a column conductor, the displaying method being such that each integration and read-out cycle comprises an integration duration common to all the pixels allowing, in each pixel, the accumulation of photogenerated charge by the photosensitive element of the pixel throughout the integration duration, then a correlated double sampling read-out phase in which the pixels of each row are successively read out. For each integration and read-out cycle, the image-taking method commands a reset of all the photosensitive elements simultaneously by applying an initialization control pulse, and the end of said pulse sets the start of the integration duration common to all the pixels, allowing, in each pixel, the accumulation of photogenerated charge by the photosensitive element of the pixel throughout said integration duration, and, during the common integration duration, the image-taking method commands, simultaneously in all the pixels, N regularly spaced transfers of charge from the photosensitive element to the memory node, N being an integer higher than or equal to 2, the memory node being configured to have a charge-storage capacity that is at least N times that of the photosensitive element, the N transfers being obtained by applying, at regular intervals during said common integration duration, N control pulses to the gate of the first transfer transistor, and the end of the Nth transfer setting the end of the common integration duration.

Preferably, the read-out node has at least N times the charge-storage capacity of the photosensitive element Preferably, N is chosen equal to 2 or 3.

BRIEF DESCRIPTION OF THE DRAWINGS

Other features and advantages of the invention are presented in the following description, with reference to the appended drawings, in which.

DETAILED DESCRIPTION

Active pixels are produced in CMOS technology in a doped (for example p-doped) active semiconductor layer and in addition comprise photodiodes, which are in principle what are called pinned photodiodes, capacitive storage nodes and transistors. Embodiments thereof employ various CMOS technologies well known to those skilled in the art.

In this description, a substrate with a p-doped active semiconductor layer, which substrate is biased to a zero reference potential and the circuits of which are supplied with a positive supply voltage denoted Vdd, is described. Those skilled in the art will know that it is necessary to invert the biases if a substrate with an n-doped active semiconductor layer is used.

Figure 1:
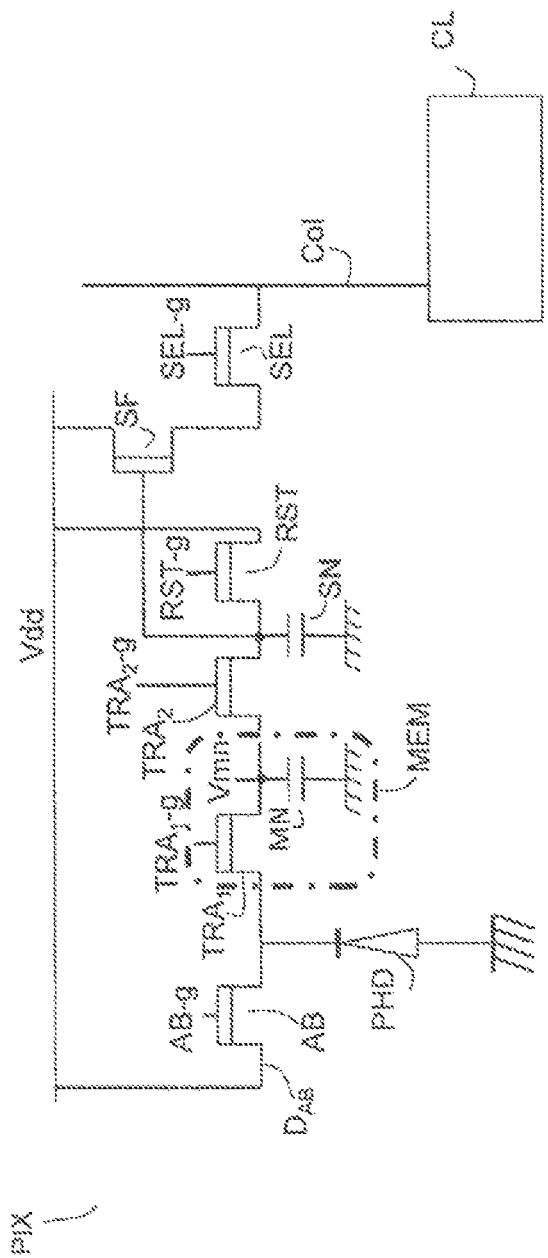
FIG. 1 illustrates a general active-pixel structure to which the invention may be applied.

FIG. 1 is an equivalent circuit of a general structure of an active pixel comprising a photosensitive element, memory node and read-out node, to which structure the invention may be applied. In this example, the pixel PIX comprises a photodiode PHD, a first capacitive storage node called the memory node and referenced MN, a second capacitive storage node called the read-out node and referenced SN and at least 5 transistors that are:

a first transfer transistor $TRA_1$ (in practice a simple transistor gate), allowing charge to be transferred from the photodiode PHD to the memory node MN.

a second transfer transistor $TRA_2$ (in practice a simple transistor gate), allowing the memory node MN to be emptied into the read-out node.

a transistor RST for resetting the read-out node SN, the source of which is electrically connected to the read-out node and the drain of which is connected to the positive supply voltage Vdd.

a follower transistor SF, the gate of which is electrically connected to the read-out node SF, and the drain of which is biased to the supply voltage Vdd.

a selection transistor SEL the gate of which receives a pixel-row selection command, the drain of which is electrically connected to the source of the follower transistor and the source of which is connected to a column conductor (Col) of the matrix array (the pixels being arrayed in a matrix of rows of pixels and columns of pixels), each column conductor being connected, at the bottom of the column, to a read-out circuit CL common to all the pixels of the column.

It may comprise a sixth transistor AB, which allows the photodiode to be initialized, by allowing charge to be removed via its drain. One advantage of this sixth transistor is that it enables what is called an anti-blooming function, i.e. by biasing its gate to a set voltage under the threshold voltage of the transistor, it is possible to adjust the potential of the barrier of the semiconductor region under the gate to a level that allows excess charge to be removed from the photodiode via the drain of the transistor. When it is not provided, the photodiodes are initialized by activating, together in each pixel, the transistors $TRA_1$, $TRA_2$ and RST.

It will be noted that certain transistors of the pixel may in practice be shared between at least two pixels, this possibly being advantageous when it is sought to produce small pixels with a high fill factor. For example, the follower transistor and the row-selection transistor are shared between two or four pixels of a given column. The photodiode-initialization transistor may also be shared between at least two pixels. The area of active layer required to control the pixels is thus decreased. The invention also applies to these shared-transistor pixel structures.

The photodiode PHD is usually a pinned photodiode pinned to a voltage denoted $V_{pin}$ and defined by the technology, i.e. it includes, in the n-type diffusion region, a superficial p-type diffusion region and the superficial region is brought to the (zero) reference potential of the substrate.

The read-out node SN, which is the equivalent of a capacitor, in practice consists of a floating n-doped semiconductor region. The charge-storage capacity of the read-out node at least corresponds to that of the photodiode. This capacity especially depends on the dopant concentration and the geometry of the memory node.

The memory node MN is the equivalent of a capacitor for storing the charge generated and accumulated by the photodiode at the end of an integration period. In practice, this memory node is not a floating diffusion like the read-out node. Specifically, it must be possible to set its potential to a given level that must be higher than the photodiode voltage $V_{pin}$, at least in the phase of transfer of charge from the photodiode to the memory node; and which must be lower than the supply voltage Vdd, at least in the phase of transfer of charge from the memory node to the read-out node. Its potential may therefore change, depending on the phase in question, i.e. depending on whether the memory node is the source or the destination of the transferred charge. But it may also be set. In the rest of the description, and in the drawings, it is this option (set potential) that is shown, for the sake of greater simplicity.

For example, the memory node is a semiconductor region surmounted by a gate, and this gate is biased to a potential that allows a given potential level between the level $V_{pin}$ of the photodiode and Vdd to be applied to the memory-node semiconductor region under the gate. The charge-storage capacity under this gate then depends on the gate capacitance (and therefore its geometry), on the dopant concentration, etc. Other exemplary embodiments of memory nodes may be found in the prior art of what are called (at least) six-transistor pixels; for example, patent publications WO2006130443, U.S. Pat. No. 598,629 and FR2961631.

In an example in which the substrate is p-type, these various transistors will be nMOS transistors, i.e. they will have source and drain regions that are n-type diffusions on either side of a p-type channel under the gate.

The term "transistor" is used to facilitate comprehension in terms of an equivalent circuit diagram such as the diagram in FIG. 1. However, in the physical make-up of the pixel, these transistors are not necessarily all formed in the conventional way, independently of the other elements of the pixel, with a source region, a drain region, a channel region separating the source from the drain and an insulated gate on top of the channel. In the actual physical make-up of the pixel, certain transistors in fact essentially consist of an insulated gate to which a control potential may be applied. Thus, for example, the first transfer transistor $TRA_1$ will consist of a simple transfer gate $TRA_1$-g insulated from the substrate, surmounting a p-type channel region that is located between the n-type photodiode PHD region (source of $TRA_1$) and the n-type region of the memory node NM (drain of $TRA_1$). Likewise: the source of the second transfer transistor $TRA_2$ may be the n-type region of the memory node NM, and the drain of this transistor $TRA_2$ may be the n-type region of the read-out node SN. Furthermore, the source of the initialization transistor AB may be the n-type region of the photodiode that accumulates the charge generated by the light; and the source of the transistor RST may be the n-type region of the read-out node.

The invention does not relate to a particular active-pixel technology, but indeed to the use of an active-pixel structure comprising a photodiode, a read-out node and a memory node between the photodiode and read-out node and, for example, to a structure such as described above, with or without an anti-blooming transistor AB. Furthermore, the active-pixel structure may comprise one or more transistors shared with at least one other pixel.

In the invention, provision is made, as regards control of the active pixel, for the following two measures:

the charge-storage capacity of the memory node is at least N times higher than the charge-storage capacity of the photodiode (N being an integer higher than or equal to 2); and charge is transferred N times from the photodiode to the memory node, these transfers being regularly spaced, during each integration duration of a periodic charge integration and read-out cycle.

Figure 2:
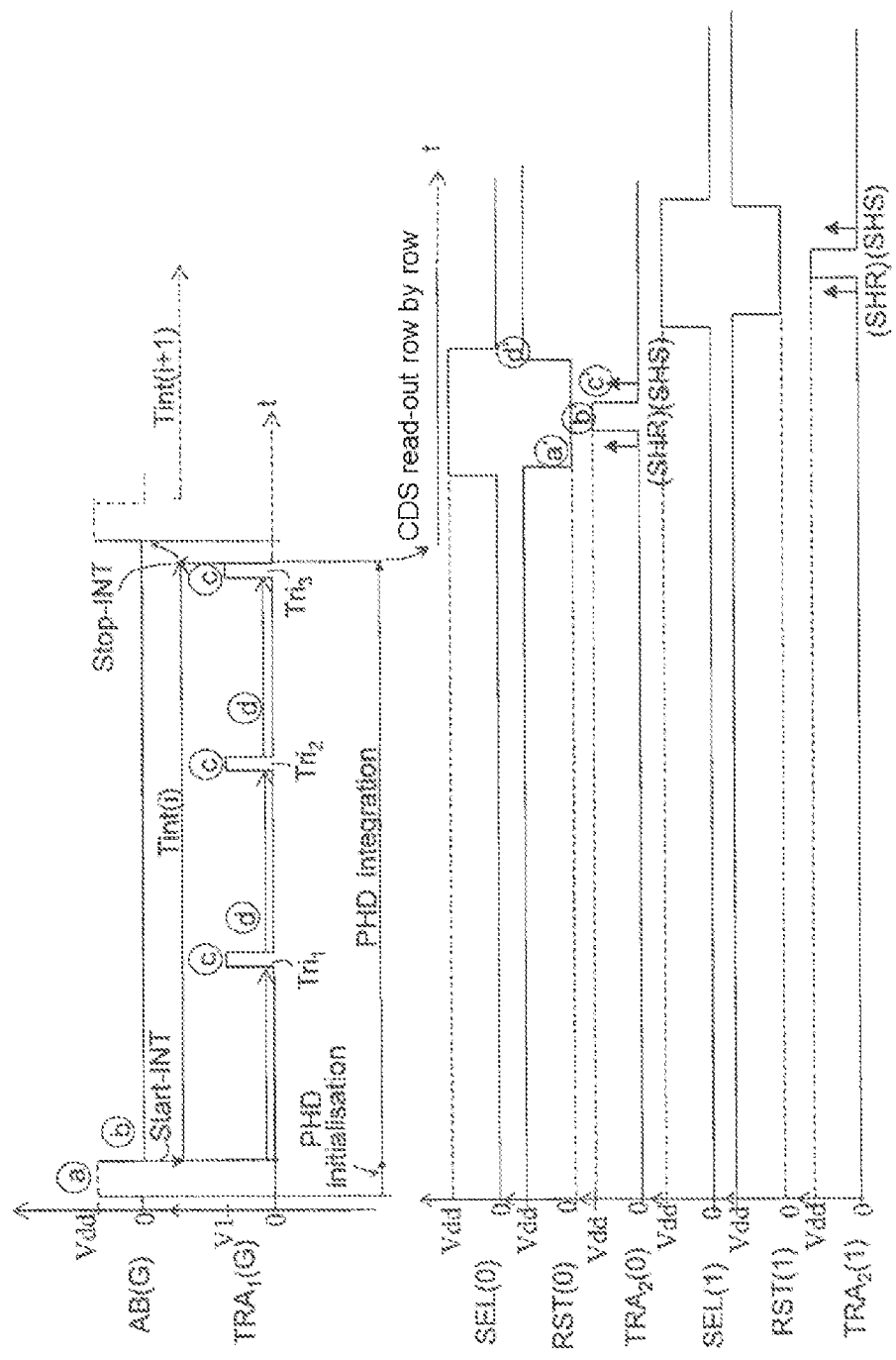
FIG. 2 is a timing diagram of the control signals of an active pixel implementing an image-taking method according to the invention.

Thus, as illustrated by the timing diagram in FIG. 2 for an example in which N is equal to 3, after the start of the integration duration Tint(i) of an ith integration and read-out cycle, which start is set by the falling edge of the gate control pulse AB-g of the photodiode-initialization transistor AB, N=3 control pulses $Tri_1$, $Tri_2$ and $Tri_3$ are applied in succession, at regular intervals, to the gate $TRA_1$-g of the first transfer transistor $TRA_1$. The falling edge of the last (Nth) pulse $Tri_3$ marks the end of the current integration duration Tint(i).

In this way, in case of high light levels, as charge is transferred a plurality of times during the integration period, the photodiode will be able to continue to accumulate charge throughout the integration duration; the charge is added in the memory node on each transfer. The transfers are carried out at regular intervals that are equally distributed over the integration duration Tint. In other words, in this example in which N=3, the time interval between the start of integration and the 1st transfer, between the 1st and 2nd transfers, and between the 2nd and 3rd transfers, is substantially the same.

The two measures of the invention allow a method for controlling pixels to be implemented that has the technical effect of multiplying by N the charge accumulation capacity in each pixel over the duration of the integration period for a given photodiode capacity. However, this accumulation does not occur in the photodiode. In the invention, this accumulation occurs in the memory node, because charge is transferred at regular intervals from the photodiode to the memory node throughout the integration duration. As indicated above, the memory node is not subject to the same technological limitations as the photodiode: therefore it is possible to produce a memory node with the desired storage capacity, at least equal to N times the capacity of the photodiode, without adversely affecting the size of the pixel.

The read-out node also preferably has, for its part, a capacity at least equal to N times that of the photodiode.

Preferably, N is equal to 2 or 3.

An active-pixel sensor having the general (electrical) structure in FIG. 1 is especially suitable for an image-taking method employing an integration duration that is common to all the pixels (global shutter) and a row-by-row correlated double sampling (CDS) read-out of the pixels by the read-out circuit at the bottom of each column.

The control method according to the invention, which uses a memory node the capacity of which is at least N times that of the photodiode, is particularly suitable and advantageous for such an image-taking method.

Such an image-taking method is now described with reference to the timing diagram of the control signals of the transistors, which diagram is shown in FIG. 2, and the diagrams of potentials in FIGS. 3 and 4. In FIGS. 3 and 4, the value of the potential of the various gates, which are represented by rectangles, is indicated by the fill colour of each rectangle: white=zero; black=$V_{dd}$; grey=intermediate potential. Furthermore, to facilitate comprehension, the steps and the FIG. 3 or 4 that correspond to these steps are referenced by one and the same letter. Lastly, it will be noted that the timing diagrams and potential-barrier representation in FIGS. 2 to 4 correspond to a context in which the sensor is produced in a p-type active layer. Those skilled in the art will be able make the conversion to a context in which the active layer is n-type.

An initial state (not shown in FIGS. 3 and 4) is started from, in which state the transistors are all in the off state.

Each periodic integration and read-out cycle comprises an integration duration Tint common to all the pixels, then a CDS read-out of the pixels, row by row.

Figure 3A:
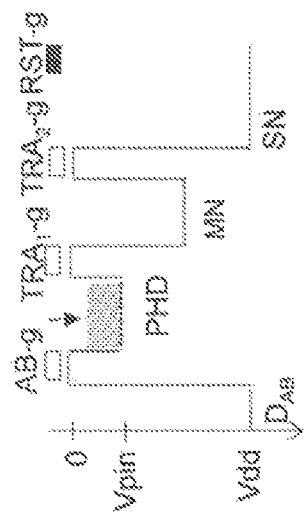
FIGS. 3a to 3d show diagrams of the potentials in the structure of the pixel corresponding to various steps a) to d) of the integration duration.
Figure 3B:
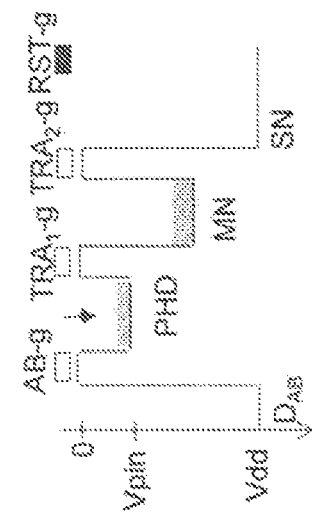
Figure 3C:
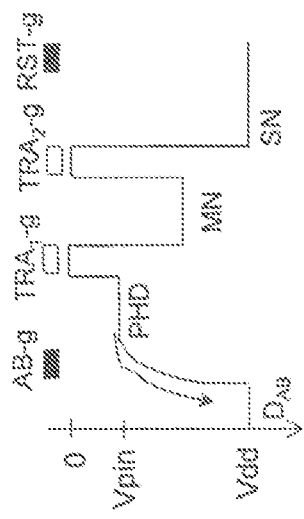
Figure 3D:
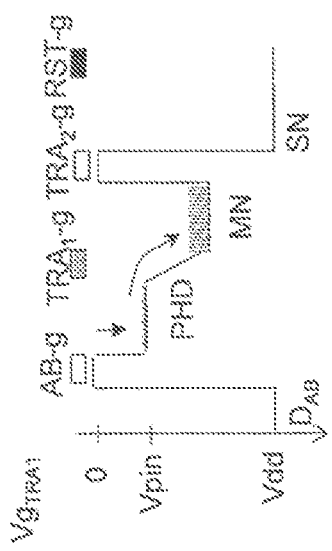

As illustrated in FIG. 2, each integration and read-out cycle starts with a step a) of initializing all the photodiodes simultaneously. A corresponding diagram of the potentials in the structure is illustrated in FIG. 3a.

In this step, an initialization control pulse AB(G) is applied simultaneously to the gates AB-g of all the initialization transistors AB: these are then fully turned on and empty the associated photodiode of all charge, via the drain $D_{AB}$ of the associated transistor. In a structure without an anti-blooming transistor AB, the photodiodes would be initialized by simultaneously turning on, for the time of the initialization pulse, the first and second transfer transistors and the reset transistor of the read-out node. The charge would then be evacuated to the drain of the reset transistor.

The end of the common initialization pulse AB(G) causes the transistors AB to return to the off state and sets the start Start-INT of the integration duration Tint(i) for all the photodiodes PHD simultaneously: the photodiodes may, from this moment in time, once again accumulate the charge generated under the effect of the light to which they are exposed. This is step b) illustrated in FIGS. 2 and 3b.

The following step c) (FIGS. 2 and 3c) consists in applying via the control signal TRA1(G) applied to all the gates $TRA_1$-g of the pixels, a first control pulse $Tri_1$: the first transfer transistors $TRA_1$ are at this moment fully turned on, and the charge generated and accumulated by each photodiode from the start Start-INT of the current integration duration is transferred to the associated memory node. In the example, the voltage level corresponding to the active state of the control pulse $Tri_1$ is a level V1 intermediate between 0 and Vdd, in order to lower the potential barrier of the semiconductor region under the gate $TRA_1$-g to a level that allows the charge to transfer from the photodiode to the memory node.

At the end of the control pulse $Tri_1$, the photodiode again begins to accumulate charge: this is step d) (FIGS. 2 and 3d), until the next control pulse $Tri_2$.

Thus, steps c) and d) are applied to all the pixels simultaneously and are repeated in succession until the Nth transfer pulse, which is the 3rd pulse $Tri_3$ in the example illustrated in FIG. 2: the end of this Nth pulse marks the end Stop-INT of the current integration duration Tint(i).

A new integration duration Tint(i+1) of a new periodic cycle (of integration then read-out) may then start, repeating the steps a, b, c and d described above.

Figure 4B:
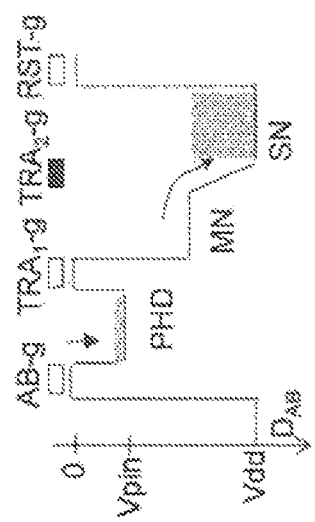
FIGS. 4a to 4c show diagrams of the potentials in the structure of the pixel corresponding to various steps a') to c') of the read-out phase.
Figure 4A:
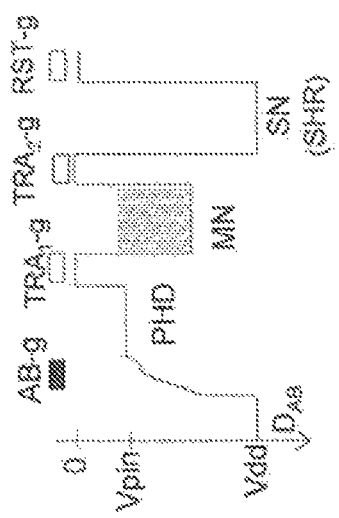
Figure 4C:
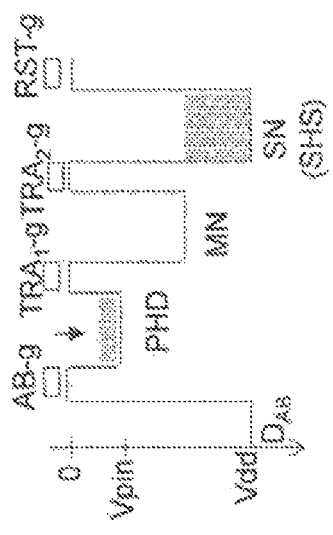

With the end Stop-INT of the current integration duration Tint(i), the following phase of read-out of the pixels may start. It is a sequential row-by-row read-out. The pixels of a row are selected by applying a selection control pulse to the gate SEL-g of the selection transistor SEL of each pixel (FIG. 2: signal SEL(0) for the first row of rank 0), this causing, for each pixel of the selected row, the source of the follower transistor SF of the pixel to be electrically connected to the corresponding column conductor and therefore to the corresponding read-out circuit CL, for the time of this selection pulse. The CDS read-out of the pixels of the selected row is carried out during this selection time, and comprises the series of following steps a') to d'):

a') the gate RST-g of the reset transistor of the read-out node of each of the pixels of the selected row is drawn to the zero potential (FIG. 2: control signal RST(0) at zero for the row of rank 0), this gate being maintained at Vdd otherwise. The potential on the column conductor then reaches a reference level that is sampled by the read-out circuit at the bottom of the column. This sampling is represented in FIGS. 2 and 4a by the signal SHR.

b') the second transfer transistor $TRA_2$ of each pixel of the selected row is turned on, for the time of a control pulse of level Vdd, which is applied to their gate $TRA_2$-g (signal TRA₂(0) for the selected row of rank 0—FIG. 2), allowing charge to be transferred from the memory node to the read-out node (FIGS. 2 and 4b).

c') at the end of this transfer pulse, the potential of the column conductor reaches a signal level representative of the amount of charge on the read-out node, and this signal level is sampled by the read-out circuit at the bottom of the column (SHS, FIGS. 2 and 4c).

d') the gate RST-g of the transistor is returned to the potential Vdd (RST(0)=Vdd) then the row is deselected (end of the selection pulse SEL(0)—FIG. 2).

Steps a' to d' are applied simultaneously to all the pixels of the selected row.

The sequence of read-out steps a') to d') is repeated for each of the rows of pixels in succession, as illustrated in FIG. 2, for the following row of rank 1, with the corresponding control signals SEL(1), RST(1) and TRA₂(1).

At the same time as the following read-out phase, an integration duration Tint(i) is ongoing, or after this read-out phase, a new integration duration (Tint(i+1)) of a following integration and read-out cycle may start.

However, the read-out of all the rows must be terminated before the first transfer pulse Tri1 produced after a duration Tint(i+1)/N following the start of the following integration duration Tint(i+1).

The invention just described allows the dynamic range of an active pixel comprising an intermediate memory node between the photosensitive element and the read-out node to be improved by obviating technological constraints without increasing the area of the photosensitive element. It may even be envisaged to decrease this photosensitive-element area while compensating for the loss of fill factor by using a microlens on each pixel to concentrate the light toward the photosensitive area of the pixel.

The invention is particularly advantageous for miniaturized sensors if it is furthermore envisaged to implement it with memory-node technologies that provide a capacitance per unit area that is intrinsically higher than that achieved with the technologies of pinned photodiodes.

The invention claimed is:

1. A method for taking images with an active-pixel sensor comprising at least one row of active pixels, in which the active pixels each comprise a photosensitive element, a read-out node and a memory node between the photosensitive element and the read-out node, and at least one first charge-transfer transistor between the photosensitive element and the memory node, one second charge-transfer transistor between the memory node and the read-out node, one transistor for resetting the read-out node, one follower transistor having its gate connected to the read-out node and one pixel-selection transistor that is connected between the source of the follower transistor and a column conductor, the image-taking method being such that each integration and read-out cycle comprises simultaneously initialization all the photosensitive elements by emptying charge from the photosensitive elements to a removal drain, integrating charge in the photosensitive elements during a common integration duration that starts at the end of the initialization of all the photosensitive elements, transferring charge from the memory node to the read-out node after the end of the common integration duration and, for each row in succession, reading out charge contained in the memory node via correlated double sampling, after the end of the common integration duration, wherein for each integration and read-out cycle, the image-taking method comprises, during the common integration duration, N regularly spaced transfers of charge from the photosensitive element to the memory node, N being an integer higher than or equal to 2, the photosensitive element accumulating charges throughout said integration duration, the memory node being configured to have a charge-storage capacity that is at least N times that of the photosensitive element, the N transfers being commanded by applying, at regular intervals during said common integration duration, N control pulses to the gate of the first transfer transistor, and the end of the Nth transfer setting the end of the common integration duration.

2. The method according to claim 1, wherein the read-out node has at least N times the charge-storage capacity of the photosensitive element.

3. The method according to claim 1, wherein N is equal to 2 or 3.

4. The method according to claim 2, wherein N is equal to 2 or 3.

5. The method of claim 4, wherein N is equal to 2.

6. The method of claim 4, wherein N is equal to 3.

7. The method of claim 3, wherein N is equal to 2.

8. The method of claim 3, wherein N is equal to 3.

* * * * *